United States Patent [19]

Schulze et al.

[11] Patent Number: 5,459,356
[45] Date of Patent: Oct. 17, 1995

[54] POWER SEMICONDUCTOR MODULE HAVING A PLURALITY OF SEMICONDUCTOR ARRANGEMENTS

[75] Inventors: Gerhard Schulze, Lippstadt; Karl-Heinz Sommer, Warstein; Reinhold Spanke, Bestwig; Gyoergy Papp, Erlangen; Walter Springmann, Adelsdorf; Peter Zwanziger, Nuremberg, all of Germany

[73] Assignees: Eupec Europeische Gesellsch F. Leistungshalbleiter MBH & Co., KG., Warstein-Belecke; Siemens Aktiengesellschaft, Munich, both of Germany

[21] Appl. No.: 390,435

[22] Filed: Feb. 16, 1995

Related U.S. Application Data

[63] Continuation of Ser. No. 112,616, Aug. 26, 1993, abandoned.

[30] Foreign Application Priority Data

Aug. 26, 1992 [EP] European Pat. Off. .............. 92114544

[51] Int. Cl.[6] .............................. H01L 23/16; H01L 23/48
[52] U.S. Cl. .......................... 257/773; 257/692; 257/723; 257/776; 361/760; 361/778; 361/784
[58] Field of Search ...................................... 257/723, 773, 257/776, 925, 691, 692; 361/260, 264, 772, 777, 778, 784

[56] References Cited

U.S. PATENT DOCUMENTS

| | | | |
|---|---|---|---|
| 4,423,434 | 12/1983 | Komatsu | 257/925 |
| 4,670,833 | 6/1987 | Sachs | 363/132 |
| 4,816,984 | 3/1989 | Porst et al. | 363/56 |
| 4,907,068 | 3/1990 | Amann et al. | 357/74 |
| 5,264,727 | 4/1993 | Kudou et al. | 257/773 |
| 5,266,826 | 11/1993 | Umeyama | 257/773 |

FOREIGN PATENT DOCUMENTS

| | | |
|---|---|---|
| 0427143 | 5/1991 | Germany. |
| 4032370 | 4/1992 | Germany. |
| 9203000.9 | 7/1992 | Germany. |

Primary Examiner—Rolf Hille
Assistant Examiner—David Ostrowski
Attorney, Agent, or Firm—Hill, Steadman & Simpson

[57] ABSTRACT

A plurality of semiconductor arrangements arranged on interconnects are connected parallel to one another in a module. The arrangements lie opposite one another in pairs. At least one pair and at most two pairs of semiconductor arrangements are arranged to follow one another in the direction of an axis of the module and are further connected to lead conductors. Positions of the lead conductors with respect to the contacted semiconductor arrangements are the same for each pair of semiconductor arrangements or, respectively, two respective pairs of semiconductor arrangements. Corresponding lead conductors are connected to one another above the interconnects.

7 Claims, 3 Drawing Sheets

POWER SEMICONDUCTOR MODULE HAVING A PLURALITY OF SEMICONDUCTOR ARRANGEMENTS

This is a continuation of application Ser. No. 08/112.616, filed Aug. 26, 1993, now abandoned.

BACKGROUND OF THE INVENTION

The present invention generally relates to a power semiconductor module having a plurality of semiconductor arrangements lying opposite one another in pairs. More specifically, the present invention relates to a power semiconductor module having a plurality of semiconductor arrangements which are arranged on interconnects and connected in parallel to one another having substantially adjacent, band-shaped lead conductors parallel to one another and connected to the interconnects.

A power semiconductor module is generally known, for example, such as that disclosed in European Patent 0 427 143 and in German Utility Model G 9203000. In these devices, the power semiconductor module includes parallel, band-shaped lead conductors lying close to one another to reduce the inductance of the module. For example, the module disclosed in European Patent Application 0 427 143 shows a symmetrical structure having four semiconductor arrangements.

With such a structure, however, the plurality of semiconductor arrangements, for example six or more, must be connected in parallel to one another for high currents of, for example, 1000 A and above. In known modules, the paths from the semiconductor arrangements to the lead conductors are of different lengths given, for example, six or more semiconductor arrangements connected in parallel to one another. As a result, the asymmetry within the modules restricts the usable range of current and voltage of the individual semiconductor arrangements since electrical properties of the module are determined by the semiconductor arrangement having the highest parasitic inductance.

A need, therefore, exists for an improved power semiconductor module having improved electrical properties.

SUMMARY OF THE INVENTION

The present invention provides at least one pair and at most two pairs of semiconductor arrangements lying behind one another in the direction of an axis of the module. The semiconductor arrangements are connected to two substantially adjacent lead conductors. The positions of the lead conductors relative to the semiconductor arrangements are the same for all of the pairs of semiconductor arrangements or, respectively, for the two pairs of semiconductor arrangements. Further, the lead conductors corresponding to one another are electrically connected to one another above the interconnects.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
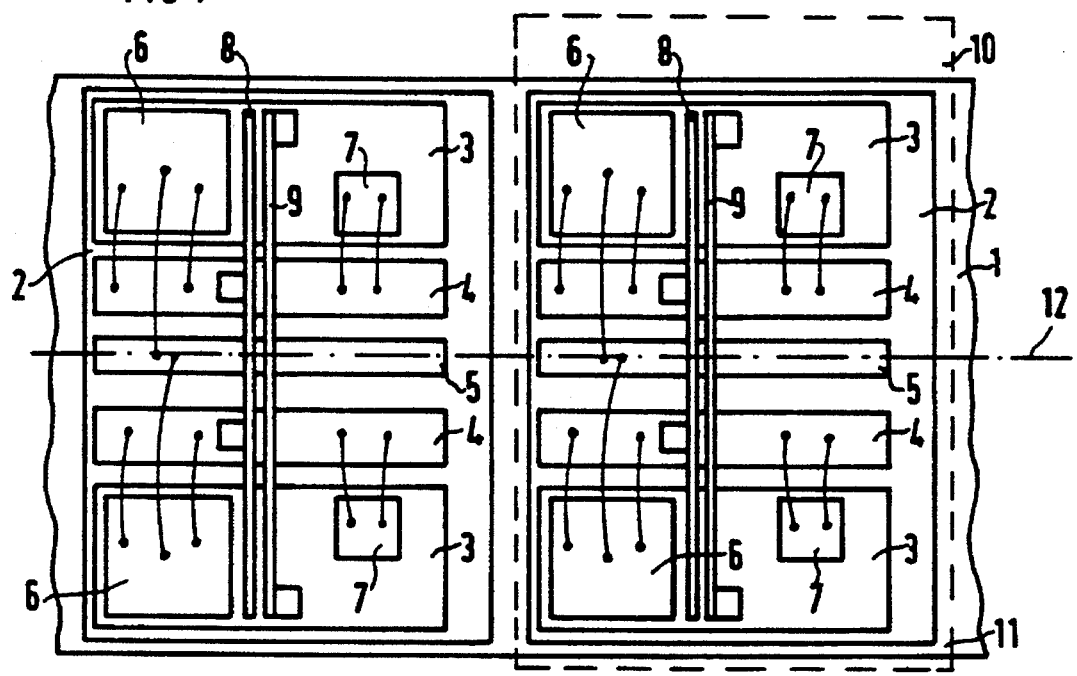
FIG. 1 illustrates a plan view of an embodiment of the present invention.

Referring to FIG. 1, a power semiconductor module is illustrated having a metallic floor 1 on which insulating layers are arranged. The insulating layers 2 carry interconnects 3, 4 and 5. Semiconductor arrangements 10 and 11 on the interconnects 3, 4 and 5 symmetrically mirror one another relative to a symmetry axis 12. The semiconductor arrangements 10 and 11 are composed of a field effect-controlled semiconductor component 6 and of a diode 7 connected as shown in FIG. 1. The field effect-controlled semiconductor 6 can, for example, be a MOSFET or an IGBT (Isolated Gate Bipolar Transistor). One side of the semiconductor component 6 directly contacts the interconnect 3, whereas the other side contacts the interconnect 4 via bond wires. The interconnect 5 contacts control terminals.

The interconnects 3, 4 are connected to lead conductors 8, 9, respectively, that reside perpendicularly on the interconnects 3, 4. The lead conductors 8, 9 are band-shaped, parallel to one another, and arranged in close proximity to one another.

Depending on the current-carrying capability of the module, a plurality of semiconductor arrangements identical to the semiconductor arrangements 10, 11 may be provided on the same floor 1. Each pair of semiconductor arrangements symmetrically mirror one another having the lead conductors 8, 9. The position of the lead conductors 8, 9 relative to the semiconductor arrangements 10, 11 is identical for every pair of semiconductor arrangements in the direction of the symmetry axis 12. That is, a plurality of units composed of the lead conductors 8, 9 and the semiconductor arrangements 10, 11 corresponding to the current-carrying capability are arranged on the floor 1. The units are, therefore, identical to one another.

The semiconductor arrangements 10, 11 of each pair are connected in parallel by the lead conductors 8, 9. The lead conductors 8, 9 of each pair are connected to one another above the interconnects 3, 4 by band-shaped or plate-shaped connecting lines. All of the lead conductors 8 are thereby electrically combined by a first connecting line, and all of the lead conductors are electrically combined by a second connecting line.

Figure 3:
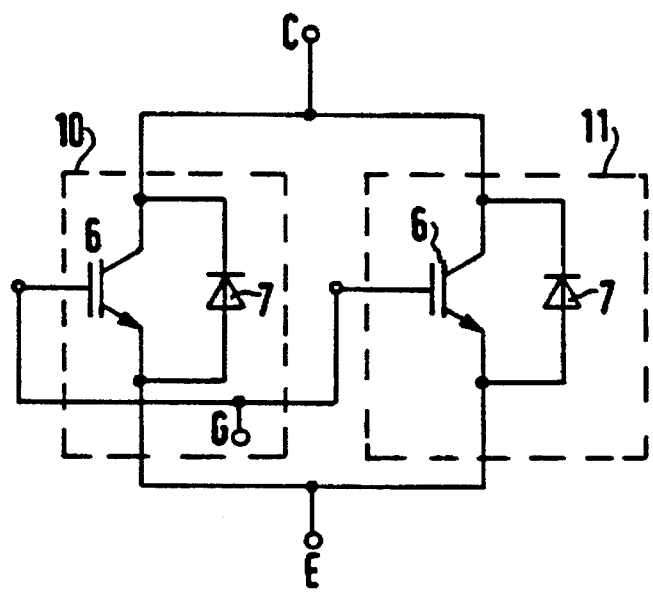
FIG. 3 illustrates a circuit diagram of the embodiment of the present invention illustrated in FIG. 1.

Referring now to FIG. 3, an electrical equivalent of the arrangement of FIG. 1 is shown. Each of the semiconductor arrangements 10, 11 is composed of the field-effect controlled semiconductor component 6, such as a MOSFET or an IGBT, to which a free-wheeling diode 7 is connected in parallel.

Figure 2:
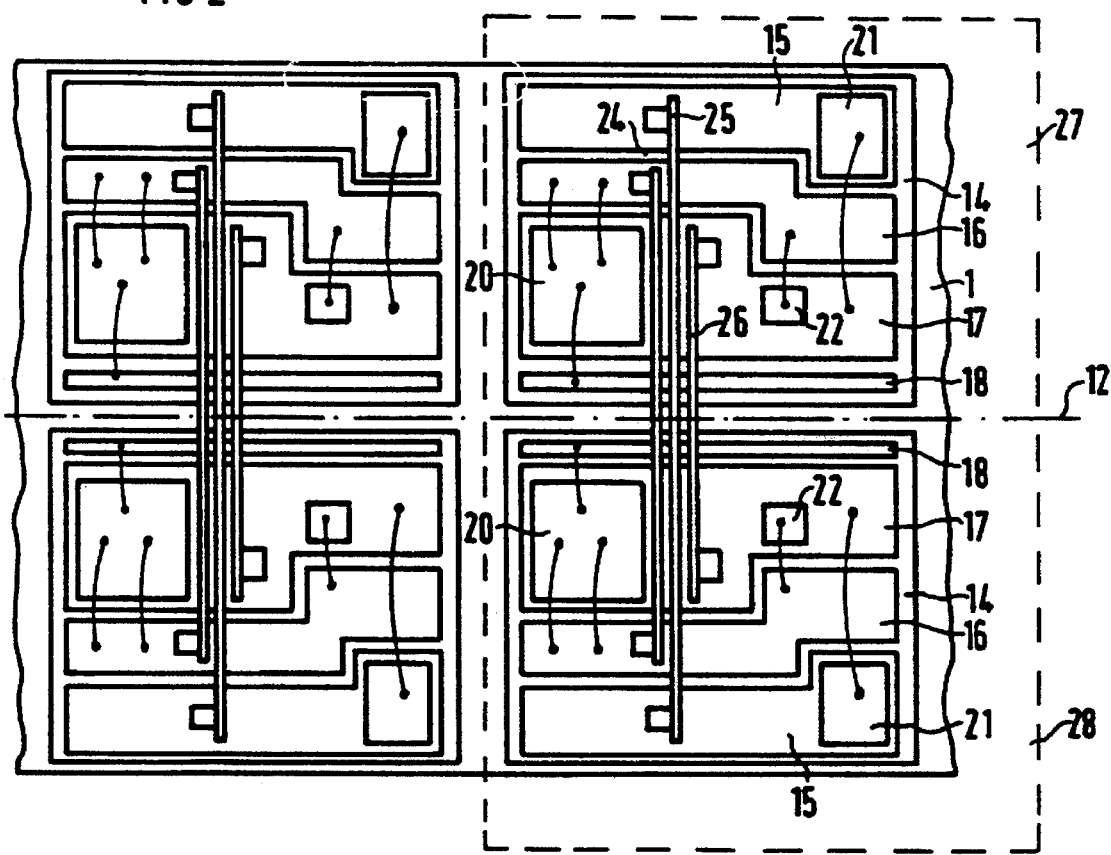
FIG. 2 illustrates a plan view of another embodiment of the present invention.

Referring now to FIG. 2, another embodiment of a semiconductor module is illustrated which is again constructed on a metal floor 1. As shown, semiconductor arrangements 27, 28 each having four interconnects 15, 16, 17 and 18 lie opposite one another to symmetrically mirror one another relative to the symmetry axis 12. A free-wheeling diode 21 is arranged on the interconnect 15. A field effect-controlled semiconductor component 20, such as a MOSFET or an IGBT, and a protective diode 22 are arranged on the interconnect 17.

Figure 4:
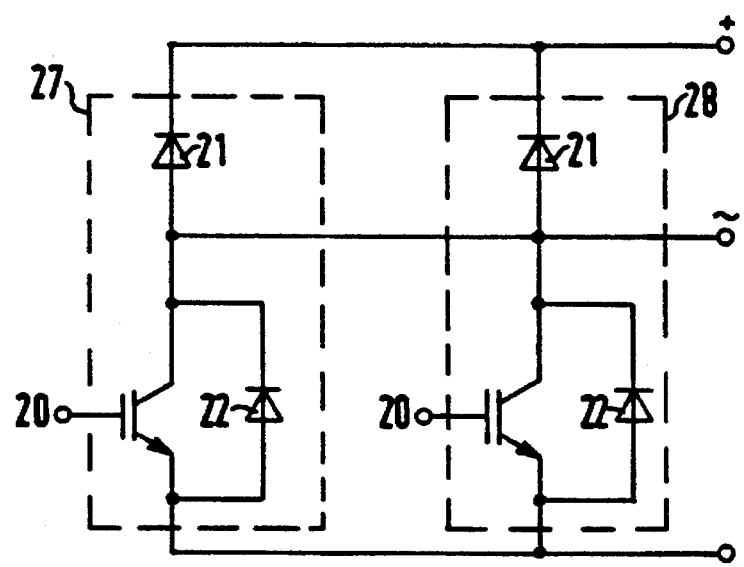
FIG. 4 illustrates a circuit diagram of the embodiment of the present invention illustrated in FIG. 2.

FIG. 4 illustrates an electrical equivalent of the arrangement of FIG. 2. A bridge arm is illustrated having a positive terminal, a change terminal and a negative terminal. The bridge arm is shown respectively composed of a series circuit of the diode 21 and the semiconductor component 20 such as an IGBT to which the protective diode 22 is connected anti-parallel. The positive terminal corresponds to the interconnect 15, the change terminal corresponds to the interconnect 16 and the negative terminal corresponds to the interconnect 17. The interconnect 18 is connected to the gate terminal of the semiconductor component 20.

The interconnects 15, 16 and 17 are connected with three lead conductors 24, 25 and 26 which are each respectively arranged perpendicularly relative to the plane of the interconnects 15, 16 and 17. Further, the three lead conductors 24, 25 and 26 are parallel to one another and in close proximity to one another. The lead conductors 24, 25 and 26 each respectively connect one pair of semiconductor arrangements 27, 28 lying opposite one another to symmetrically mirror one another in parallel.

Depending on the current-carrying capability of the module, further pairs of semiconductor arrangements lying opposite one another to symmetrically mirror one another may be arranged on the floor 1. The further pairs of semiconductor arrangements are identical to the first pairs, like that described in the embodiment of FIG. 1. The pairs of semiconductor arrangements are respectively contacted by the three lead conductors 24, 25 and 26. The lead conductors 24, 25 and 26 of each pair of semiconductor arrangements are then, likewise, connected to one another by a connecting line above the level of the interconnects. In such a case, three connecting lines are required.

The symmetrical structure of the modules illustrated in FIGS. 1 and 2 results from the fact that the distance from the semiconductor components 6 and 7 (FIG. 1) or the semiconductor components 20, 21 and 22 (FIG. 2) to the allocated lead conductors is always identical. The symmetry leads to identical inductances for every arrangement and, thus, to improved electrical properties.

Figure 5:
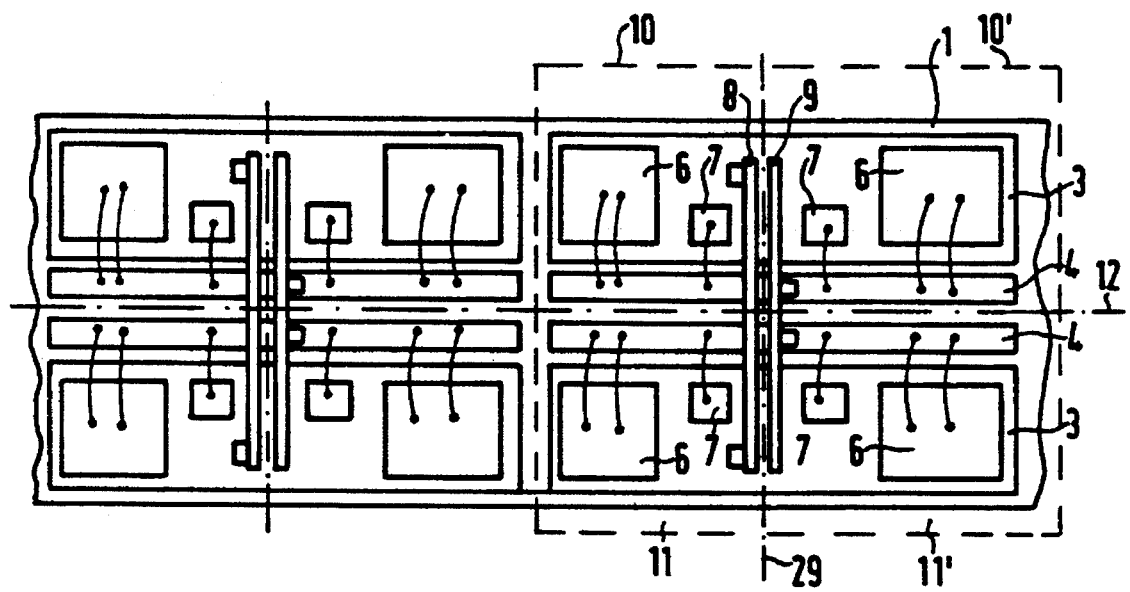
FIG. 5 illustrates a plan view of a third embodiment of the present invention.
Figure 6:
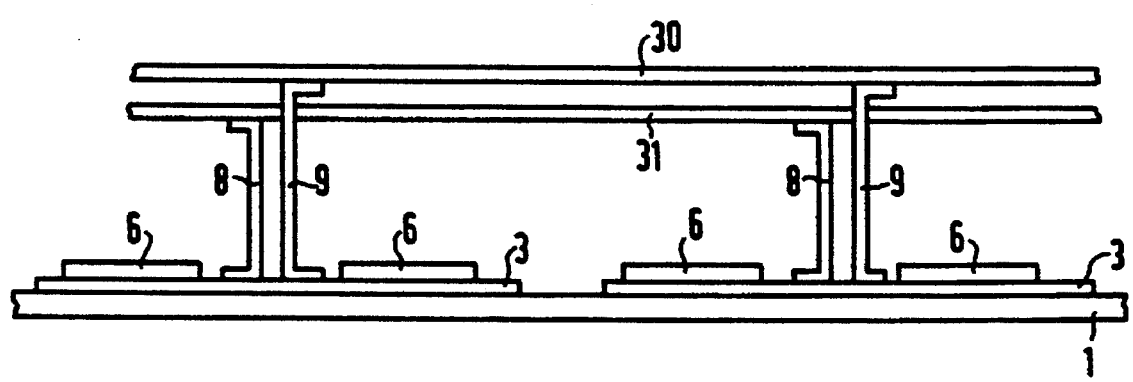
FIG. 6 illustrates a side view of the third embodiment of the present invention illustrated in FIG. 5.

Referring now to FIG. 5, a power semiconductor module is illustrated having pairs of semiconductor arrangements 10, 11 lying opposite one another to symmetrically mirror one another relative to the symmetry axis 12. Further, semiconductor arrangements 10', 11 are arranged on the same interconnect 3 to symmetrically mirror one another relative to the semiconductor arrangements 10, 11 whereby a second symmetry axis 29 lies in a plane of the interconnects 3, 4 and at a right angle relative to the first symmetry axis 12. The pairs 10, 11 and 10', 11' are then contacted by a single pair of lead conductors 8, 9.

A plurality of such double pairs or quad arrangements are then constructed on the floor 1 according to a desired current-carrying capability. Each of the double pairs or quad arrangements is contacted by a pair of lead conductors 8, 9. The individual pair of lead conductors 8, 9 of every quad arrangement are then again contacted by connecting lines above the interconnects 3, 4. (The interconnects required for the control terminals have been omitted for the sake of clarity.) An arrangement corresponding to the module illustrated in FIG. 2 may, however, as well be implemented.

The double symmetrically mirrored structure of FIG. 5 can also be employed, for example, for the arrangement of FIG. 2. Like the arrangement of FIG. 2, the distances from the semiconductor component 6 (FIG. 5) or, respectively, the semiconductor components 20, 21 (FIG. 2) to the allocated lead conductor are the same. The parasitic inductances are, therefore, also the same, and exploitability of the power semiconductor module is assured.

The arrangements set forth above further provides that each of the interconnects connected to a control terminal is connected to a lead conductor. The lead conductors are connected to one another above the interconnects corresponding to the lead conductors for the load current.

Referring now to FIG. 5, the pairs of lead conductors 8, 9 are schematically shown. The pairs of lead conductors 8, 9 belonging to one another are connected to one another. This occurs with connecting lines 30, 31 that respectively connect the lead conductors 9, 8 to one another. The different heights of the lead conductors 8, 9 are selected for the sake of clarity. In practice, the heights of all of the lead conductors are substantially the same. Further, the connecting lines 30, 31 can lie inside a housing. However, the connecting lines 30, 31 may, in the alternative, lie on the housing because a plurality of semiconductor power modules can be connected parallel to one another in this way.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim as our invention:

1. A power semiconductor module having a plurality of semiconductor arrangements arranged on and electrically connected to interconnects and connected in parallel to one another and lie opposite one another in pairs along an axis lying parallel to a floor of the module, the module comprising:

a plurality of lead conductors wherein the plurality of lead conductors are connected to the interconnects such that at least one pair of the semiconductor arrangements and at most two pairs of the semiconductor arrangements lying behind one another in a direction of the axis are connected to at least two of the plurality of lead conductors, the at least two of the plurality of lead conductors being arranged in close immediate proximity and parallel to one another such that positions of the plurality of the at least two lead conductors with respect to the semiconductor arrangements are the same for each of the pair of semiconductor arrangements or for each of the two pairs of semiconductor arrangements resulting in symmetry of the semiconductor arrangements along the axis and identical inductances with respect to the semiconductor arrangements wherein the lead conductors corresponding to one another being electrically connectable above the interconnects by connecting lines.

2. The power semiconductor module of claim 1 wherein the lead conductors are arranged between the two pairs of semiconductor arrangments connected in parallel and following one another in the direction of the axis.

3. The power semiconductor module of claim 1 wherein each of the semiconductor arrangements further comprises:

field effect-controlled semiconductor components having a free-wheeling diode connected thereto anti-parallel.

4. The power semiconductor module of claim 1 wherein each of the semiconductor arrangements further comprises:

a series circuit of a diode and a field effect-controlled semiconductor component wherein a node of the series circuit is connected by an interconnect to a third lead conductor that is in substantial proximity to two other lead conductors and further wherein the third lead conductors are connected to one another above the interconnects.

5. The power semiconductor module of claim 1 wherein the semiconductor arrangements lying opposite one another along the axis symmetrically mirror one another relative to the axis.

6. The power semiconductor module of claim 2 wherein the pairs of semiconductor arrangements lying at both sides of the lead conductors symmetrically mirror one another relative to a a plane of the lead conductors.

7. The power semiconductor module of claim 1 further comprising:
 a housing surrounding the semiconductor arrangements and the lead conductors; and
 connecting lines outside of the housing for connecting the semiconductor arrangements and the lead conductors.

* * * * *